(12) United States Patent
Inenaga et al.

(10) Patent No.: US 7,436,513 B2
(45) Date of Patent: Oct. 14, 2008

(54) WAFER PRE-ALIGNMENT APPARATUS AND METHOD

(75) Inventors: Masamichi Inenaga, Fukuoka (JP); Shinichi Katsuda, Fukuoka (JP); Yuji Arinaga, Fukuoka (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 143 days.

(21) Appl. No.: 10/516,693

(22) PCT Filed: Apr. 11, 2003

(86) PCT No.: PCT/JP03/04670

§ 371 (c)(1),
(2), (4) Date: Dec. 6, 2004

(87) PCT Pub. No.: WO03/105217

PCT Pub. Date: Dec. 18, 2003

(65) Prior Publication Data

US 2005/0231721 A1    Oct. 20, 2005

(30) Foreign Application Priority Data

Jun. 6, 2002   (JP)  ............................. 2002-165250

(51) Int. Cl.
  *G01B 11/00*   (2006.01)
(52) U.S. Cl. ...................................... 356/400
(58) Field of Classification Search ............... 356/400
  See application file for complete search history.

(56) References Cited

U.S. PATENT DOCUMENTS

| 5,289,263 | A |   | 2/1994  | Kiyokawa et al. |       |
|-----------|---|---|---------|-----------------|-------|
| 5,684,599 | A | * | 11/1997 | Shimoyama et al.| 356/400|
| 5,880,816 | A | * | 3/1999  | Mimura et al.   | 355/53 |
| 5,929,976 | A | * | 7/1999  | Shibuya et al.  | 355/53 |
| 5,982,474 | A | * | 11/1999 | Akiyama et al.  | 355/53 |

FOREIGN PATENT DOCUMENTS

JP    5-160245 A    6/1993

* cited by examiner

*Primary Examiner*—Tarifur R. Chowdhury
*Assistant Examiner*—Isiaka O Akanbi
(74) *Attorney, Agent, or Firm*—Sughrue Mion, PLLC

(57) ABSTRACT

A wafer pre-alignment apparatus according to this invention includes a wafer rotating member, a rotation detecting member, a light emitting member for emitting light toward the periphery of the wafer, a COD linear sensor linearly arranged and signal processing member for detecting the edge position of the wafer to acquire at least one of an orientation flat position, notch position and center position of the wafer on the basis of the edge position detected, and further includes an up-down counter for converting a signal received from the rotation detecting member into rotating position information, a measured angle setting register for storing the rotation position information when the wafer rotating member rotates by an interval angle and a comparator for comparing a set value in the measured angle setting register and a counted value in the up-down counter.

2 Claims, 4 Drawing Sheets

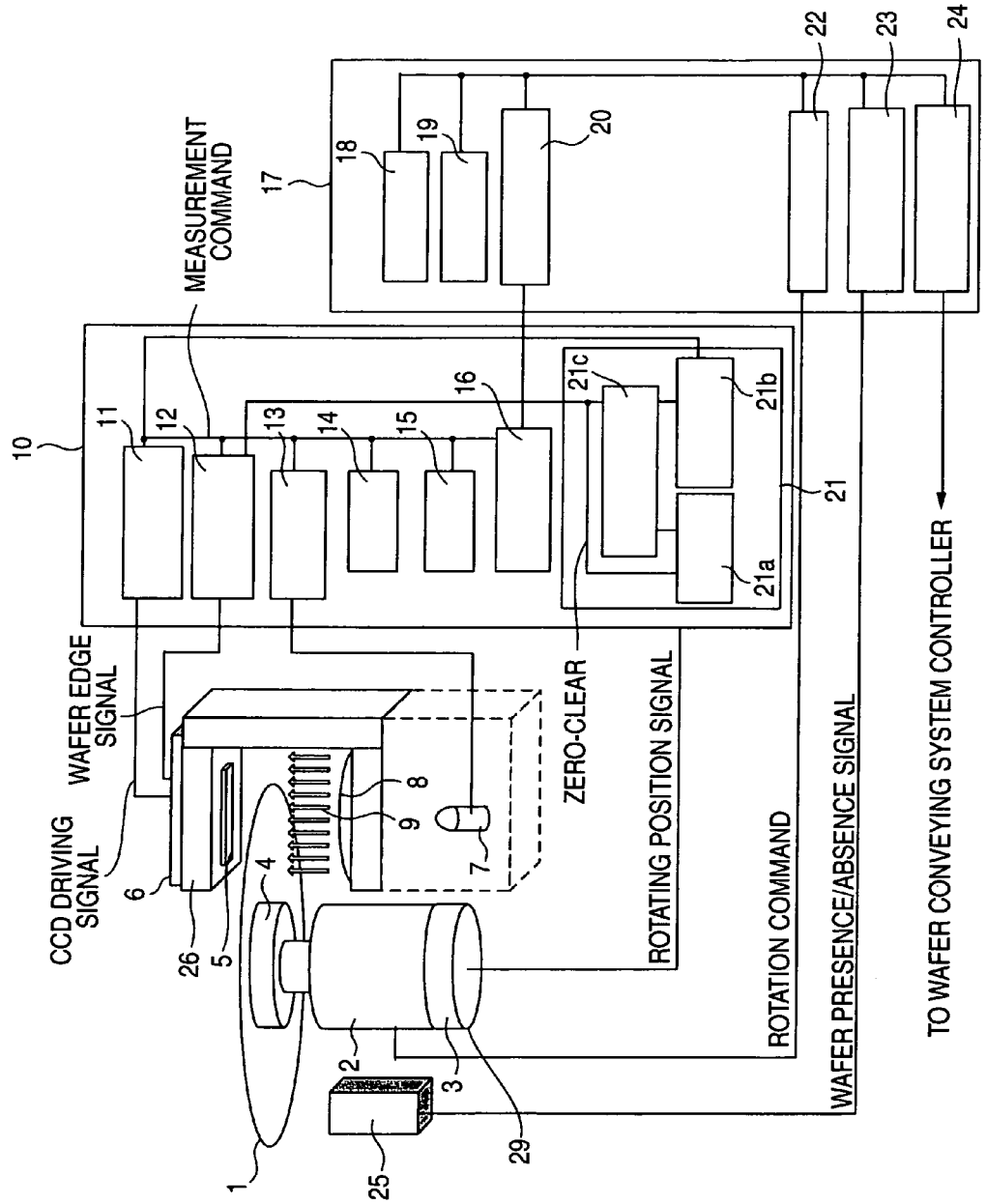

WAFER PRE-ALIGNMENT APPARATUS AND METHOD

TECHNICAL FIELD

This invention relates to a pre-alignment apparatus which is employed in a semiconductor manufacturing apparatus and serves to detect/position the position of a disk-shaped semiconductor wafer and the positions of orientation flat, notch, etc. thereof.

RELATED ART

Referring to FIG. 4, an explanation will be given of the configuration of a prior art pre-alignment sensor apparatus. In FIG. 4, a table 4 secured to the upper tip of the axis of a motor 2 is adapted to be movable. When a wafer 1 is placed on the table 4, it can intervene between a light source 7 which is located on the lower side of the outer peripheral region of the wafer and a CCD linear sensor 5 which is a light receiving unit located on the upper side thereof. A pre-alignment sensor 26 includes a light source 7, a lens 8, the CCD linear sensor 5, a substrate 6 on which the CCD linear sensor is mounted, and a frame with a side of U-shape which fixes these components. The light emitted from the light source 7 is collimated by a lens 8 and the light thus collimated is received by a CCD linear sensor 5. A sensor controller 10 includes a CCD linear sensor driving unit 11, a wafer edge detecting unit 12, a light-emission driving unit 13, a memory 14, a CPU 15, and a data transfer unit 16. A system controller 17 includes a memory 18, a CPU 19, a data transfer unit 20, an encoder signal processing unit 21, a motor director 22, a wafer presence/absence sensor signal unit 23 and a wafer conveying control unit 24. The light-emission driving unit 13 supplies a current to the light source 7 to emit light. The CCD linear sensor 11 driving unit 11 supplies, to the CCD linear sensor 5 (which includes a large number of pixel arranged linearly in a prescribed order), a read-out-gate pulse (ROG) signal (which is a timing signal when the charge stored in the pixel is changed into an electric signal) and a transfer pulse signal. The CCD linear sensor 5 further reads out the stored charges successively from the first pixel at a scanning starting end according to the transfer pulse signal, thereby successively producing the stored charges of all the pixels as detected signals. The wafer edge detecting unit 12 receives the detected signals and others to detect the positions of the wafer edge. The detected information is externally outputted through the data transfer unit 16.

The motor director 22 in the system controller 17 supplies a rotation command signal to the motor 2 so that the motor 2 is rotated. A wafer presence/absence sensor 25, which is an optical sensor, contact type sensor or capacitance type sensor, is provided separately from the pre-alignment sensor 26. The wafer presence/absence sensor signal processing unit 23 actuates the wafer presence/absence sensor 25 to detect whether or not the wafer is present in front of the sensor 25. The encoder signal processing unit 21 acquires a rotating signal from the encoder 3 connected to the motor 2.

In the configuration described above, the system controller 17 and the sensor controller 10 operate as follows. The system controller 17, if the wafer is not present on the table 4, rotates the table 4 after a wafer conveying system (not shown) has conveyed the wafer to the table 4, and measures the signal from the encoder 3 by the encoder signal processing unit 21. When the motor 2 has come to a predetermined rotating position, the system controller 10 outputs a measurement command through the data transfer unit 20 to start the measurement.

The sensor controller 10, after it has received the above measurement command, receives the wafer edge signal outputted from the CCD linear sensor 5 by the wafer edge detecting unit 12, and sends the detected value of the wafer edge through the data transfer unit 16 to the system controller 17. The system controller 17 stores the wafer edge detected value and a measured rotating position in the memory 18 and repeats the same operation until the wafer 1 makes a single or more revolution to store the outer peripheral data corresponding to one round of the wafer in the memory 18. On the basis of the outer peripheral data corresponding to the one round of the wafer, the center position and orientation flat or notch of the wafer 1.

However, according to a prior art, in order that the signal from the encoder 3 when the table 4 is rotated is measured by the encoder signal processing unit 21 to determine whether the table has come to the predetermined rotating position, the system controller 17 must store the same number of pieces of measurement position information as the measurement points in the memory 18. Thus, the CPU 19 must always monitor the measurement position information stored and the rotating position information acquired from the encoder 3.

Further, because of uneven rotation of the table 4, the value of the signal from the encoder 3 measured at a predetermined position may vary. As a result, it is likely to measure the signal at the same measurement position repeatedly. Thus, it is impossible to realize the downsizing, cost reduction, effectiveness of the system, and high speed of the system. This leads to a serious problem in order to increase the diameter of the wafer and improve the throughput thereof.

DISCLOSURE OF THE INVENTION

In view of the above circumstance, this invention intends to provide an apparatus and a method which can easily determine that the wafer 1 has come to a predetermined measurement position through addition of an function to the encoder signal processing 21 so that a measurement command is issued to the sensor controller 10 to start measurement.

In order to solve the above problem, this invention provides a wafer pre-alignment apparatus including:

a wafer rotating member capable of rotating a disk-shaped wafer held on a table having a vertical rotating axis;

a rotation detecting member for detecting a rotating position of the wafer rotating member and converting the rotating position detected into an electric signal;

a light emitting member for emitting light toward the periphery of the wafer held by the wafer rotating member;

a CCD linear sensor including a large number of pixels linearly arranged in a predetermined order, for reading out stored charges successively from the first pixel according to a transfer pulse signal and successively outputting stored charges of all the pixels as electric signals;

a signal processing member for repeatedly detecting the edge positions of the wafer at a plurality of optional points over the outer periphery of the wafer when it receives a signal from the CCD linear sensor and a signal from the rotation detecting member and storing these edge positions thus detected in a memory, and acquiring at least one of an orientation-flat position, notch position and center position of the wafer on the basis of the edge positions detected;

an up-down counter for counting signals received from the rotation detecting member;

a measured angle setting register for storing angular value information which is obtained by dividing the number of counts during a single revolution by the rotation detecting member by the number of measurement points during the single rotation; and a comparator for comparing the angular value information set in the measured angle setting register and the counted value of the up-down counter.

In this configuration, it is possible to easily determine that the wafer has come to a predetermined measurement position so that a measurement command can be issued to the sensor controller to start measurement.

BRIEF DESCRIPTION OF THE DRAWINGS

FIG. 2 is a block diagram showing the configuration of a second embodiment of this invention.

BEST MODE FOR CARRYING OUT THE INVENTION

Figure 1:
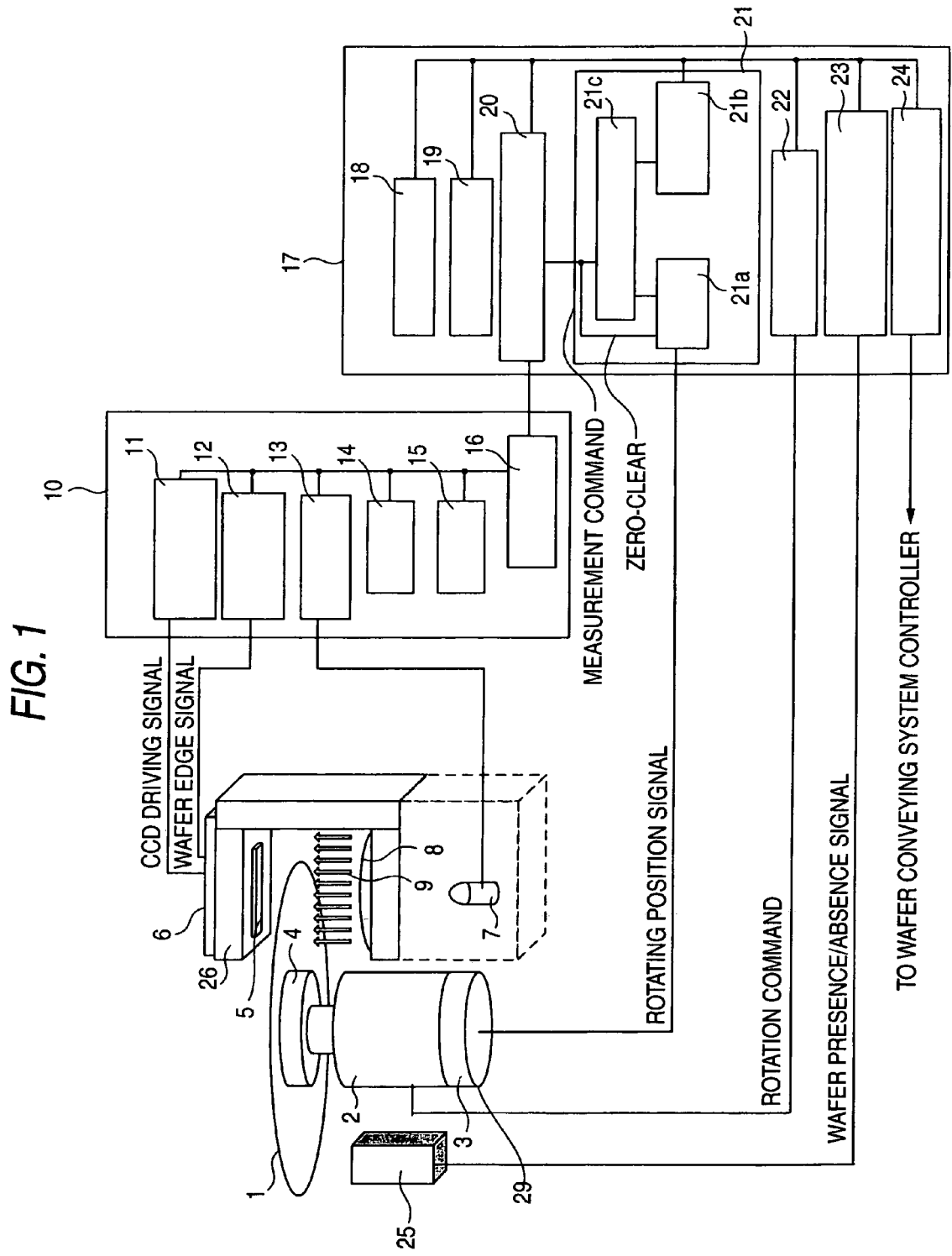
FIG. 1 is a block diagram showing the configuration of a first embodiment of this invention.

Now referring to the drawings, an explanation will be given of embodiments of this invention. FIG. 1 is a block diagram showing the configuration of a first embodiment of this invention.

Figure 3B:
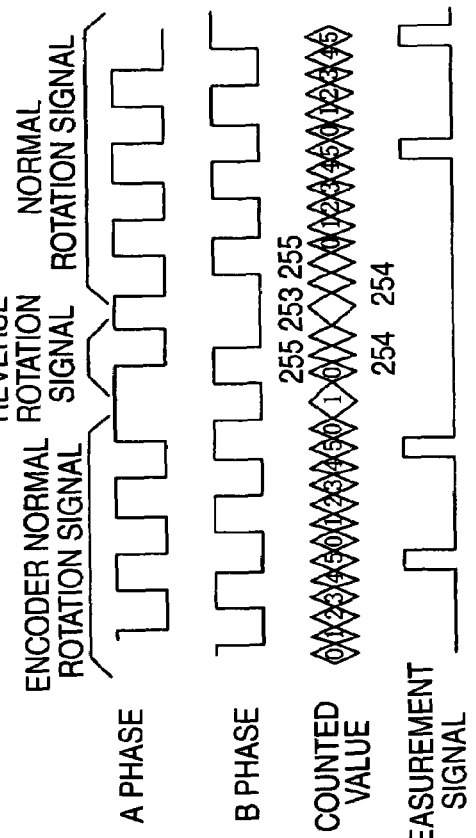
FIGS. 3(a) and 3(b) are timing charts for explaining the encoder processing unit according to this invention.
Figure 3A:
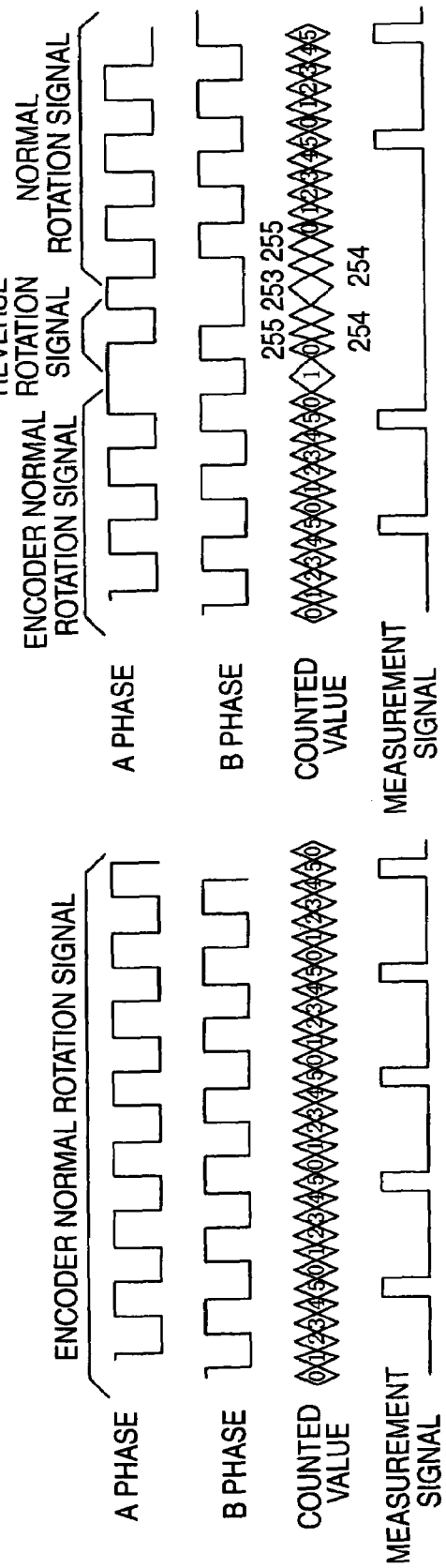

FIGS. 3(a) and 3(b) are timing charts for explaining the encoder processing unit according to this invention.

In FIG. 1, a wafer positioning mechanism 29 includes a motor 2, a table 4 which is rotated by the motor 2 to hold a measured object or a wafer thereon and an encoder 3 connected to the motor to detect the rotating position of the motor 2. A pre-alignment sensor 26 includes a frame with a side of U-shape, a light source 7, a lens 8 for collimating the light emitted from the light source 7, and a CCD linear sensor 5 for receiving the light received, these components being located beneath the frame. The CCD linear sensor 5 including a large number of pixel arranged linearly in a prescribed order. The pixels of the CCD linear sensor 5 are scanned successively from the first pixel to read out the stored charges substantially proportional to the incident light from the light source 7, thereby successively producing the stored charges of all the pixels as electric signals.

A sensor controller 10 includes a CCD linear sensor driving unit 11 for driving the CCD linear sensor 5, a wafer edge detecting unit 12 for scanning the pixels of the CCD linear sensor 5 from the first pixel to the final pixel, thereby detecting wafer edge signals at points where the signal changes, a light-emission driving unit 13 for ON/OFF controlling the light emission from the light source, a memory 14, a CPU 15, and a data transfer unit 16 for making exchange of signals between the sensor controller and the outside.

A system controller 17 includes a motor director 22 for rotating the motor 4, an encoder signal processing unit 21, a motor director 22, a memory 18 for storing a measured angle set value and wafer edge detected value, a CPU 19 and a data transfer unit 20 for performing the exchange of signals between the system controller 17 and the sensor controller 10.

The encoder signal processing unit 21 includes a measured angle setting register 21b, an up-down counter 21a and a comparator 21c. The measured angle setting register 21b serves to set the angular value which is obtained by dividing the number of counts during a single revolution by the rotation detecting member by the number of measurement points during the single revolution. The up-down counter 21a, in response to the rotating position signal from the encoder 3, up-counts during normal rotation and down-counts during reverse rotation. The comparator 21c, if it is determined that the angular value information from the measuring angle set register 21b is equal to the count value acquired by the up-down counter 21a, produces a measurement command and zero-clears the counted value.

The CPU 19, when it computes at least one of the orientation flat, notch position and center position of the wafer on the basis of the measuring angle set value and the wafer edge detected value stored in the memory 18, sends a command to a wafer conveying system (not shown) to convey the wafer 1 from the table 4 onto a conveying destination. The wafer positioning mechanism 29, pre-alignment sensor 26, sensor controller 10 and system controller 17 constitute a wafer pre-alignment apparatus.

In the configuration described above, the wafer alignment apparatus according to this invention operates as follows.

First, the system controller 17 sets the angular value information in the measured angle setting register 21b. The angular value is obtained by dividing the number of counts during a single revolution by the rotation detecting member by the number of measurement points during the single revolution.

If there is not the wafer 1 on the table 4, after the wafer conveying system not shown conveys the wafer to the table 4, the table 4 is rotated.

In the encoder signal processing unit 21, in response to the rotating position signal, the up-down counter 21a up-counts during the normal rotation of the table 4 and down-counts during the reverse rotation of the table 4 so that the counted value increases/decreases to provide the rotation position information. The comparator 21c, if it determines that the angular value information from the measured angle setting register 21b is equal to the count value acquired by the up-down counter 21a, outputs a measurement command and also simultaneously zero-clears the counted value.

When the sensor controller 10 receives the measurement command output, the wafer edge detecting unit 12 receives the wafer edge signals outputted from the CCD linear sensor 5, thereby supplying the wafer edge detected values to the system controller 17 through the data transfer unit 16.

The system controller 17 successively stores the wafer edge detected values thus received in the memory 18. The system controller 17 repeats the same operation until the wafer 1 makes one or more revolution, thereby recording the outer peripheral data corresponding to one round of the wafer 1 in the memory 18. On the basis of the outer peripheral data corresponding to the one round of the wafer, the CPU 19 executes a known operation, thereby providing the center position and orientation flat or notch of the wafer 1.

Now, it is assumed that the up-down counter 21a of the encoder signal processing unit 21 is a counter capable of up/down counting from 0 to 255. The timing chart when a set value 5 is set in the measured angle setting register 21b is shown in FIGS. 3a and 4b.

After it has been determined that the set value of the measured angle setting register 21b is equal to the counted value of the up-down counter 21a, a measuring command is issued and also the counted value is zero-cleared. This solves the problem that even when the table 4 changes only in a moment from the normal rotation into the reverse rotation owing to uneven rotation of the table 4, the measurement command is issued at the same measurement point.

Next, referring to the drawings, an explanation will be given of a second embodiment of this invention. FIG. 2 is a block diagram showing the configuration of a wafer pre-alignment apparatus according to a second embodiment of this invention.

The configuration of this embodiment is different from the first embodiment in that the encoder signal processing unit 21 including the up-down counter 21a, measured angle setting register 21b and comparator 21c is not incorporated in the system controller 17 but in the sensor controller 10.

In such a configuration, the wafer pre-alignment apparatus according to this invention operates as follows. First, the system controller 17 sets angular value information in the measured angle setting register 21b through the data transfer unit 20. The angular value information is obtained by dividing the number of counts during the single revolution by the rotation detecting member by the number of measurement points during the single revolution. If there is not the wafer 1 on the table 4, after the wafer conveying system not shown conveys the wafer to the table 4, the table 4 is rotated.

The encoder signal processing 21 incorporated in the sensor controller 10 operates as follows. In response to the rotating position signal, the up-down counter 21a up-counts during the normal rotation of the table 4 and down-counts during the reverse rotation of the table 4 so that the counted value increases/decreases to provide the rotation position information. The comparator 21c, if it determines that the angular value information from the measuring angle set register 21b is equal to the count value acquired by the up-down counter 21a, outputs a measurement command and also simultaneously zero-clears the counted value to deal with the signals successively supplied from the encoder 3.

In response to the measurement command output, the wafer edge detecting unit 12 receives the wafer edge signals outputted from the CCD linear sensor 5, thereby supplying the wafer edge detected values to the system controller 17 through the data transfer unit 16.

The system controller 17 successively stores the wafer edge detected values thus received in the memory 18. The system controller 17 repeats the same operation until the wafer 1 makes one or more revolution, thereby recording the outer peripheral data corresponding to one round of the wafer 1 in the memory 18. On the basis of the outer peripheral data corresponding to the one round of the wafer, the CPU 19 executes a known operation, thereby providing the center position and orientation flat or notch of the wafer 1.

INDUSTRIAL APPLICABILITY

In accordance with this invention, the signal from the encoder 3 is measured by the encoder signal processing unit 21. In order to determine that the motor 2 has comes to a predetermined rotating position, predetermined measurement positions corresponding to the number of measurement points are stored in the memory 18. The CPU 19 does not always monitor and compares the measurement positions and rotating positions acquired from the encoder 3. In place of this, the encoder signal processing unit 21 is designed to include the measured angle setting register 21b capable of setting the rotating position information corresponding to the angular interval between the measured points, the up-down counter 21a which processes the rotating position signal from the encoder 3 and up-counts during the normal rotation and down-counts during the reverse rotation, and the comparator 21c capable of issuing a measurement command after having determined that the angular value information from the measuring angle set register 21b is equal to the count value acquired by the up-down counter 21a and also simultaneously zero-clearing the counted value of the up-down counter in order to deal with the signals successively supplied from the rotation detecting member. In accordance with this configuration, the wafer pre-alignment apparatus can be constructed by simple hardware, the burden for the processing of the CPU can be alleviated, and the capacity of the memory can be also reduced.

Since the counted value is zero-cleared simultaneously when the measurement command is issued, owing to the uneven rotation of the table 4, the signal from the encoder 3 measured at the predetermined measurement position does not vary so that the measurement at the same position is not carried out repeatedly, thereby promoting effectiveness of the system.

Since the encoder signal processing unit 21 can be incorporated in either the system controller 17 or the sensor controller 10, the system configuration can be designed freely.

Figure 4:
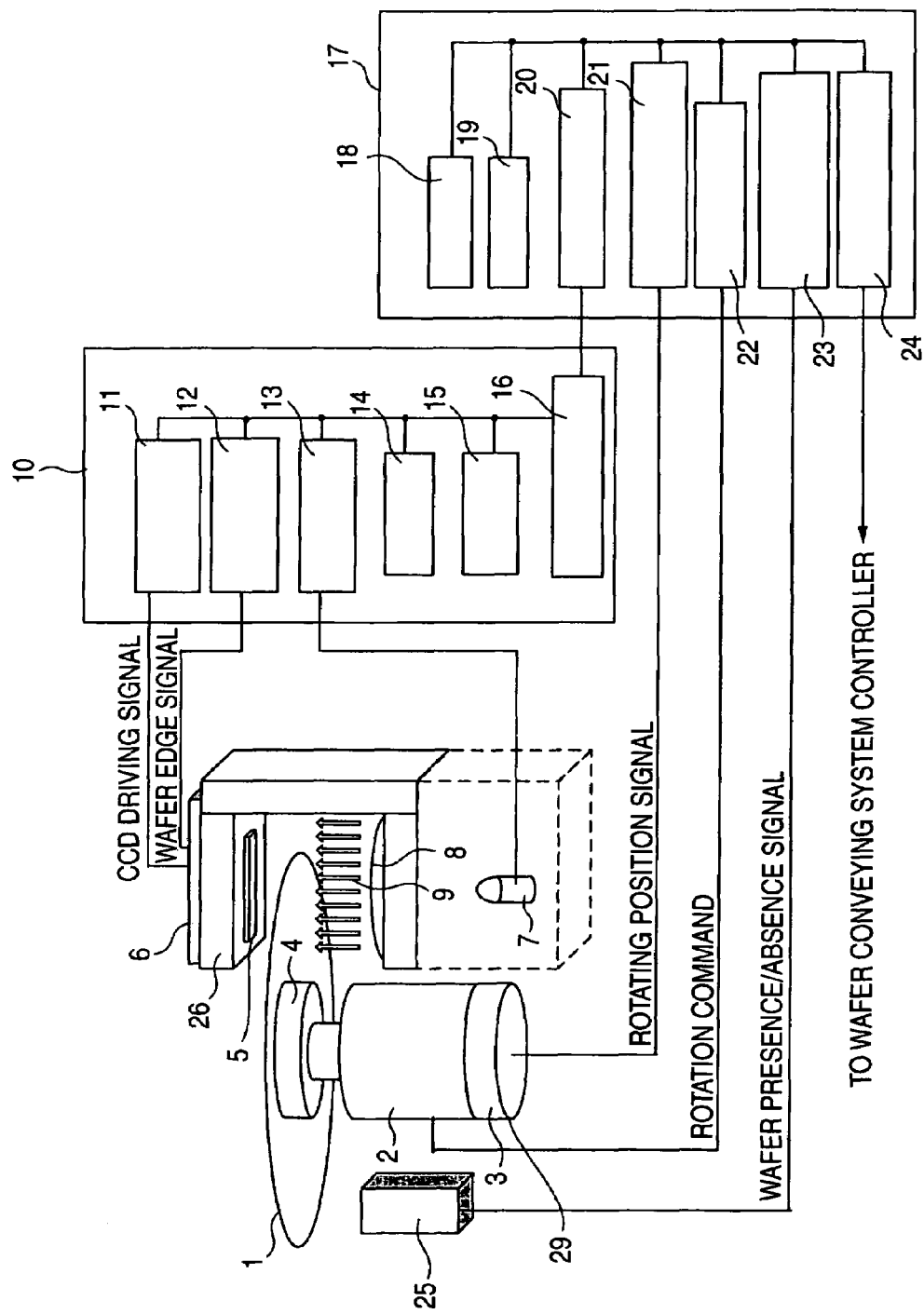
FIG. 4 is a block diagram showing the configuration of a prior art wafer pre-alignment apparatus.

[FIGS. 1, 2 and 4]
A1: CCD driving signal
A2: wafer edge signal
A3: rotating position signal
A4: rotation command
A5: wafer presence/absence signal
A6: to wafer conveying system controller
A7: measurement command
A8: zero-clear

[FIG. 3(a)]
A1: encoder normal rotation signal
A2: A phase
A3: B phase
A4: counted value
A5: measurement signal

[FIG. 3(b)]
A1: encoder normal rotation signal
A2: A phase
A3: B phase
A4: counted value
A5: measurement signal
A6: reverse rotation signal
A7: normal rotation signal

The invention claimed is:
1. A wafer pre-alignment apparatus comprising:
a wafer rotating member capable of rotating a disk-shaped wafer held on a table having a vertical rotating axis;
a rotation detecting member for detecting a rotating position of the wafer rotating member and converting the rotating position detected into an electric signal;
a light emitting member for emitting light toward the periphery of the wafer held by the wafer rotating member;
a CCD linear sensor including a large number of pixels linearly arranged in a predetermined order, for reading out stored charges successively from the first pixel according to a transfer pulse signal and successively outputting stored charges of all the pixels as electric signals;
a signal processing member for repeatedly detecting the edge positions of the wafer at a plurality of optional points over the outer periphery of the wafer when it receives a signal from the CCD linear sensor and a signal from the rotation detecting member and storing these edge positions thus detected in a memory, and acquiring at least one of an orientation-flat position, notch position and center position of the wafer on the basis of the edge positions detected;

an up-down counter for counting signals received from the rotation detecting member;

a measured angle setting register for storing angular value information which is obtained by dividing the number of counts during a single revolution by the rotation detecting member by the number of measurement points during the single rotation; and a comparator for comparing the angular value information set in the measured angle setting register and the counted value of the up-down counter, wherein the apparatus sequentially loads outer peripheral data corresponding to one round of the wafer without stopping the motor.

2. In a wafer pre-alignment apparatus comprising:

a wafer rotating member capable of rotating a disk-shaped wafer held on a table having a vertical rotating axis;

a rotation detecting member for detecting a rotating position of the wafer rotating member and converting the rotating position detected into an electric signal;

a light emitting member for emitting light toward the periphery of the wafer held by the wafer rotating member;

a CCD linear sensor including a large number of pixels linearly arranged in a predetermined order, for reading out stored charges successively from the first pixel according to a transfer pulse signal and successively outputting stored charges of all the pixels as electric signals; and a signal processing member for repeatedly detecting the edge positions of the wafer at a plurality of optional points over the outer periphery of the wafer when it receives a signal from the CCD linear sensor and a signal from the rotation detecting member and storing these edge positions thus detected, and acquiring at least one of an orientation-flat position, notch position and center position of the wafer on the basis of the edge positions detected, a method for wafer pre-alignment comprising the steps of:

setting, in a measured angle setting register, angular value information which is obtained by dividing the number of counts during a single revolution by the rotation detecting member by the number of measurement points during the single rotation;

inputting a signal supplied from the rotation detecting member in an up-down counter up-counts during normal rotation of the wafer rotating member and down-counts during reverse rotation of the wafer rotating member;

if the comparator determines that rotation position information obtained as a result of an increase/decrease of the counted value in the up-down counter during the rotation of the wafer rotating member is equal to the set value in the measured angle setting register, zero-clearing the counted value simultaneously with outputting of a measurement command, repeatedly detecting the edge position of the wafer at the measurement points over the outer periphery of the wafer; storing detected values thus obtained in a memory; and acquiring at least one of an orientation flat position, notch position and center position of the wafer, wherein the apparatus sequentially loads outer peripheral data corresponding to one round of the wafer data without stopping the motor.

* * * * *